United States Patent
Yoshida et al.

(10) Patent No.: US 6,510,597 B2
(45) Date of Patent: Jan. 28, 2003

(54) SURFACE ACOUSTIC WAVE DEVICE AND METHOD OF MANUFACTURING THE SAME

(75) Inventors: Ayako Yoshida, Tsurugashima (JP); Atsushi Onoe, Tsurugashima (JP); Kiyofumi Chikuma, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 10/043,177

(22) Filed: Jan. 14, 2002

(65) Prior Publication Data

US 2002/0105249 A1 Aug. 8, 2002

Related U.S. Application Data

(62) Division of application No. 09/606,170, filed on Jun. 26, 2000, now Pat. No. 6,348,754.

(30) Foreign Application Priority Data

Aug. 31, 1999 (JP) ............................................. 11-244524

(51) Int. Cl.$^7$ ................................................. H04R 17/00
(52) U.S. Cl. ................................. 29/25.35; 310/313 A
(58) Field of Search ............................... 29/25.35, 846; 310/311, 313 A, 313 R; 427/99, 100, 255.32, 255.36

(56) References Cited

U.S. PATENT DOCUMENTS

| | | | |
|---|---|---|---|
| 4,482,833 A | 11/1984 | Weinert et al. | 310/313 A |
| 5,064,684 A * | 11/1991 | Mir et al. | 427/555 |
| 5,281,882 A | 1/1994 | Sugai | 310/313 A |
| 5,317,666 A | 5/1994 | Agostinelli et al. | 385/122 |
| 5,395,663 A * | 3/1995 | Tabata et al. | 427/554 |
| 5,498,920 A | 3/1996 | Okano et al. | 310/313 A |
| 5,757,250 A | 5/1998 | Ichikawa et al. | 333/193 |
| 5,895,996 A | 4/1999 | Takagi et al. | 310/313 R |
| 6,356,340 B1 * | 3/2002 | Spence | 355/53 |

* cited by examiner

*Primary Examiner*—Nestor Ramirez
*Assistant Examiner*—Michael C. Zarroli
(74) *Attorney, Agent, or Firm*—Morgan, Lewis & Bockius LLP

(57) ABSTRACT

A surface acoustic wave device includes a crystalline substrate with a structure selected from the group consisting of the perovskite structure, the spinel structure, and the rock salt structure. The device also includes a thin piezoelectric crystalline film having the perovskite structure and deposited on the crystalline substrate by chemical vapor deposition, and an electrode means for generating a surface acoustic wave on the thin piezoelectric crystalline film. In the device, a surface of the crystalline substrate on which the thin piezoelectric crystalline film is deposited is a mirror surface inclined at an offset angle θ from the (001) plane of the crystalline substrate, and the electrode means have electrode fingers arranged in parallel to each other so that a surface acoustic wave propagates along one direction of crystalline axes of the thin piezoelectric crystalline film.

5 Claims, 4 Drawing Sheets

SURFACE ACOUSTIC WAVE DEVICE AND METHOD OF MANUFACTURING THE SAME

This is a divisional of application Ser. No. 09/606,170 filed on Jun. 26, 2000 now U.S. Pat. No. 6,348,754.

BACKGROUND OF THE INVENTION

1. Field of the Invention

The present invention relates to surface acoustic wave devices (hereinafter referred to as SAW devices) such as filters, resonators, and oscillators, which use surface acoustic waves traveling on a flat surface of a piezoelectric substrate and the manufacturing method therefor.

2. Description of the Related Art

The surface acoustic wave (also referred to as SAW hereinafter) has wave energy that concentrates only near the surface of a medium (an elastic body) for propagation. Therefore, the SAW device has an advantage in its suitability for generating, detecting, and controlling waves on the surface of the body. It also has an advantage of miniaturizing apparatuses that employ the SAW devices due to the wave velocity (acoustic velocity) of a few km/s. Thus, in recent years, SAW devices have been widely used in electronic communication parts.

FIG. 1 shows an example of the SAW device that is used in electronic communication parts such as a high-frequency filter. Using the SAW device requires a piezoelectric substrate 1. A pair of input electrodes 2 formed in the shape of a comb, which are formed on the piezoelectric substrate 1 converts an electric signal, which carries information, into a SAW. In addition, a pair of comb-shaped output electrodes 3 converts the SAW into an electric signal. The electrode fingers 4 of the comb-shaped output electrodes is formed in an alternate arrangement on the piezoelectric substrate 1. The SAW propagates in the direction of the parallel electrode fingers 4. A piezoelectric substrate having a larger electromechanical coupling factor, which is indicative of the efficiency of electromechanical conversion, provides higher conversion efficiency. Thus, a piezoelectric crystalline material having a large electromechanical coupling factor is desirable. A piezoelectric crystalline material substrate such as $LiNbO_3$ or $LiTaO_3$ is used. This material is an oxide single crystal perovskite-based material comprised of lithium (Li), potassium (K), tantalum (Ta), niobium (Nb) and oxygen (O).

OBJECT AND SUMMARY OF THE INVENTION

It has been recently discovered that a single crystal of $KNbO_3$ (hereinafter referred to as KN) has an electromechanical coupling factor ten times larger than that of $LiNbO_3$ or $LiTaO_3$ crystalline material. However, it is difficult to produce in volume the bulk crystal of KN at low cost, and thus research has been conducted to make a thin film crystal of KN. Accordingly, it may be conceivable to obtain thin KN films by means of a conventional deposition method such as the liquid phase epitaxial method (LPE) or the sputtering method. However, by the LPE method, it is difficult to accurately deposit a thin film of a thickness in the order of microns. In addition, the sputtering method is good at controlling the thickness of the film, however, it has a problem in that it is difficult to combine targets to obtain a thin KN film having target compositions and the substrate is liable to be damaged during the deposition process.

With such prior art deposition methods, it is difficult to grow KN films and thus in most cases, SAW devices employing such crystals can be costly.

Accordingly, an object of the present invention is to provide a SAW device having thin piezoelectric crystalline films of ferroelectric crystal, which are formed on a crystal substrate by a thin film crystal forming means such as the metal organic chemical vapor deposition (hereinafter also referred to as MOCVD) method. Furthermore, another object of the present invention is to provide a device comprising the piezoelectric crystal film with the perovskite structure such as KN having an orientation suitable for the SAW device and the manufacturing method therefor.

A surface acoustic wave device of the present invention comprises a crystalline substrate having a structure selected from the group consisting of the perovskite structure, the spinel structure, and the rock salt structure. The device also comprises a thin piezoelectric crystalline film having a perovskite structure and deposited on said crystalline substrate by chemical vapor deposition, and an electrode means for generating a surface acoustic wave on said thin piezoelectric crystalline film. The device is characterized in that a surface of said crystalline substrate on which said thin piezoelectric crystalline film is deposited is a mirror surface inclined at an offset angle θ from the (001) plane of said crystalline substrate, and said electrode means have electrode fingers arranged in parallel to each other so that a surface acoustic wave propagates along one direction of crystalline axes of said thin piezoelectric crystalline film.

In an aspect of the present invention, said thin piezoelectric crystalline film is composed of $KNbO_3$.

In another aspect of the present invention, said crystalline substrate is composed of $SrTiO_3$.

In a further aspect of the present invention, said offset angle θ is set within a range of $-10°<\theta<10°$ ($\theta \neq 0°$).

In still another aspect of the present invention, said thin piezoelectric crystalline film crystal is grown so that a-axis is oriented in a surface of growth layer thereof.

In a further aspect of the present invention, said crystalline substrate is composed of $MgAl_2O_4$.

In another aspect of the present invention, said crystalline substrate is composed of MgO.

A method for manufacturing a surface acoustic wave device according to the present invention is characterized by comprising the step of forming a mirror surface inclined at an offset angle θ from the (001) plane of a crystalline substrate with a structure selected from the group consisting of the perovskite structure, the spinel structure, and the rock salt structure. The method also comprises the step of growing, by chemical vapor deposition, a thin piezoelectric crystalline film with the perovskite structure on the inclined mirror surface of said crystalline substrate. Furthermore, the method comprises the step of forming electrode means having electrode fingers arranged on said thin piezoelectric crystalline film in parallel to each other so that a surface acoustic wave propagates along one direction of crystalline axes of said thin piezoelectric crystalline film.

According to the aforementioned surface acoustic wave device and the manufacturing method therefor of the present invention, surface acoustic wave devices comprising a thin piezoelectric crystalline film of the perovskite structure such as $KNbO_3$ with a large electromechanical coupling factor can be manufactured at low cost.

DETAILED DESCRIPTION OF THE PREFERRED EMBODIMENTS

The embodiment of the present invention is explained below with reference to the drawings.

Figure 1:
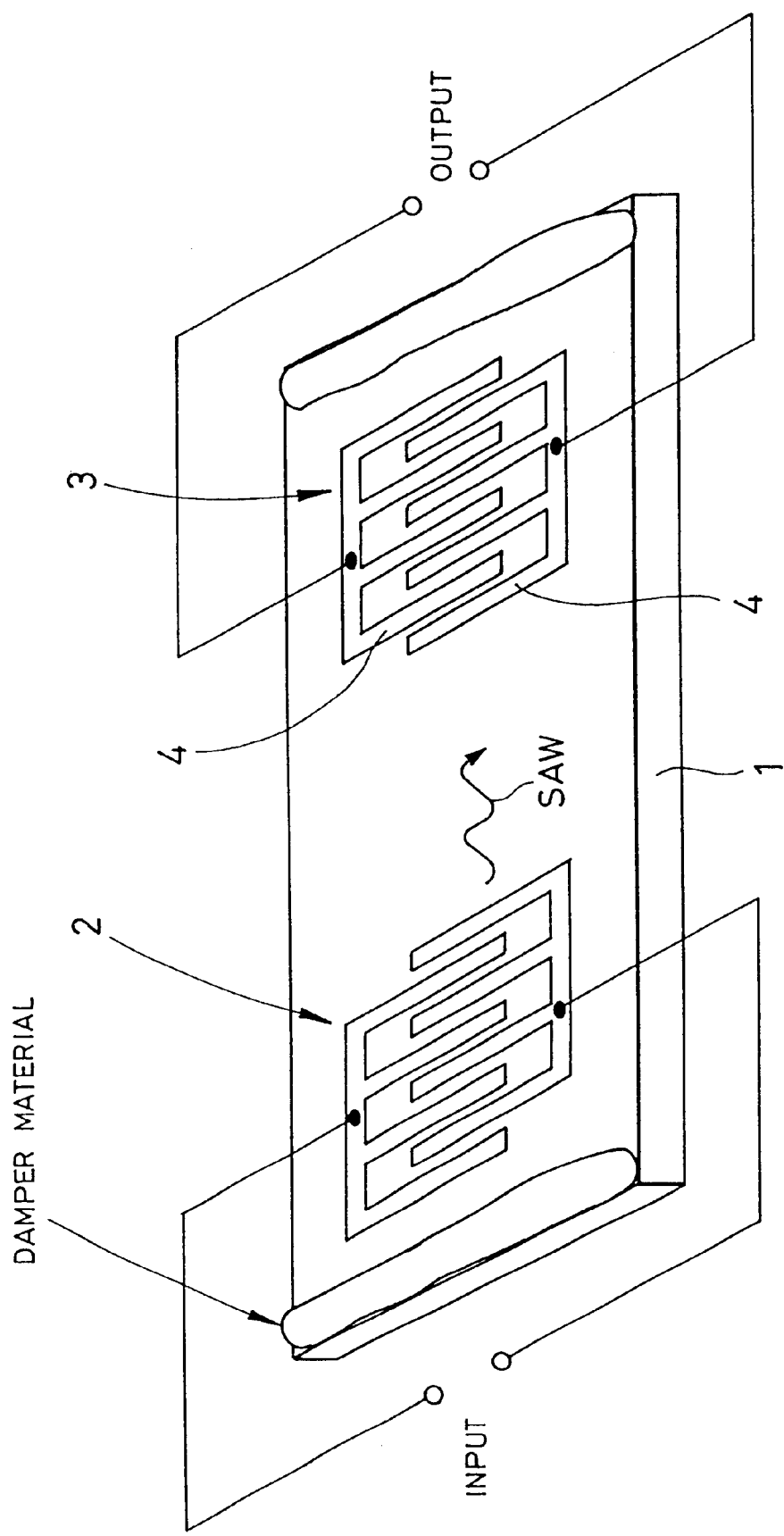
FIG. 1 is a schematic perspective views showing a SAW device.
Figure 2:
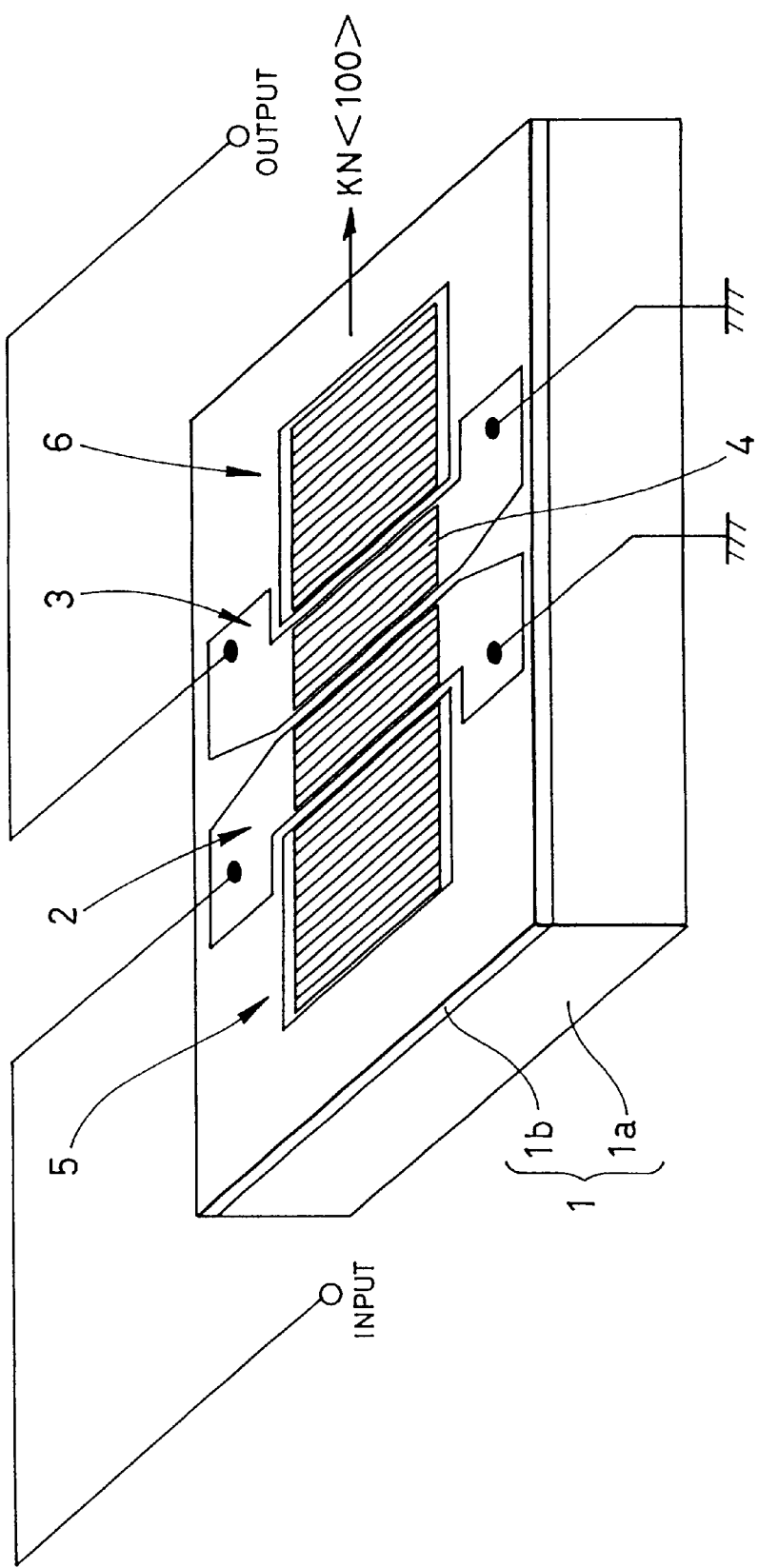
FIG. 2 is a schematic perspective views showing a SAW device according to the present invention.

FIG. 2 shows an example of a SAW device of the embodiment. As shown in the drawing, this cavity type SAW resonator comprises a pair of input and output inter-digital transducers 2, 3 (hereinafter referred to as IDT) of electrodes disposed opposite to each other in the shape of a comb, and reflectors 5, 6, disposed outside both of the IDTs, on a thin KN crystalline film 1b of the substrate 1. The substrate 1 comprises a crystalline substrate 1a having a perovskite structure of a (001) substrate with offset, for example, composed of $SrTiO_3$ (hereinafter also referred to as STO) or a titanium oxide containing strontium, and a thin piezoelectric crystalline film 1b having the perovskite structure, composed of KN deposited on the crystalline substrate by means of chemical vapor deposition. An input electric signal is converted by the input IDT 2 into a SAW. The resonance obtained by traveling back and forth between the reflectors 5, 6 is converted into an output electric signal through the output IDT 3 and then guided into an external circuit connected thereto.

The STO crystalline substrate 1a on the surface of which the thin piezoelectric crystalline film 1b of KN is formed as a mirror surface inclined at an offset angle of θ with respect to the STO (001) plane. The comb-shaped electrodes IDT, as electrode means, are formed so that a SAW propagates in one direction of the crystalline axes of the thin piezoelectric crystalline film 1b of KN, that is, along one of the crystalline axes on the (010) plane of KN. The comb-shaped electrodes IDT are preferably formed so that the SAW propagates along a crystalline axis with a large electromechanical coupling factor. That is, the electrode fingers 4 of the IDT are disposed in parallel to each other in the direction of the crystalline axis <100> of KN.

For example, in this embodiment, the IDT period LT and the reflector grating period LR are set such that LT=LR or the ratio, LT/LR, is less than 1. In addition, the frequency fR which gives the maximum reflection coefficient |Γ| of the reflectors and the frequency fT which gives the maximum radiation conductance Ga of the IDT are made or set close to each other. The excitation and reception efficiency of SAW between the IDT and reflectors are thereby increased. Moreover, aluminum (Al) is used for the conductive material of the IDTs and the reflectors, the aluminum being light in mass and easily etched. With the accuracy of etching being improved, the film thickness is set to not greater than 1000 Å to avoid degradation in resonance sharpness Q and the difference in level between the resonance peak and the second peak of the reflectors, that is, the spurious response (SR) which is derived from the mass effect due to an increase in thickness (bulk wave conversion and multiple reflection between electrodes at IDTs and the reflectors).

Figure 3:
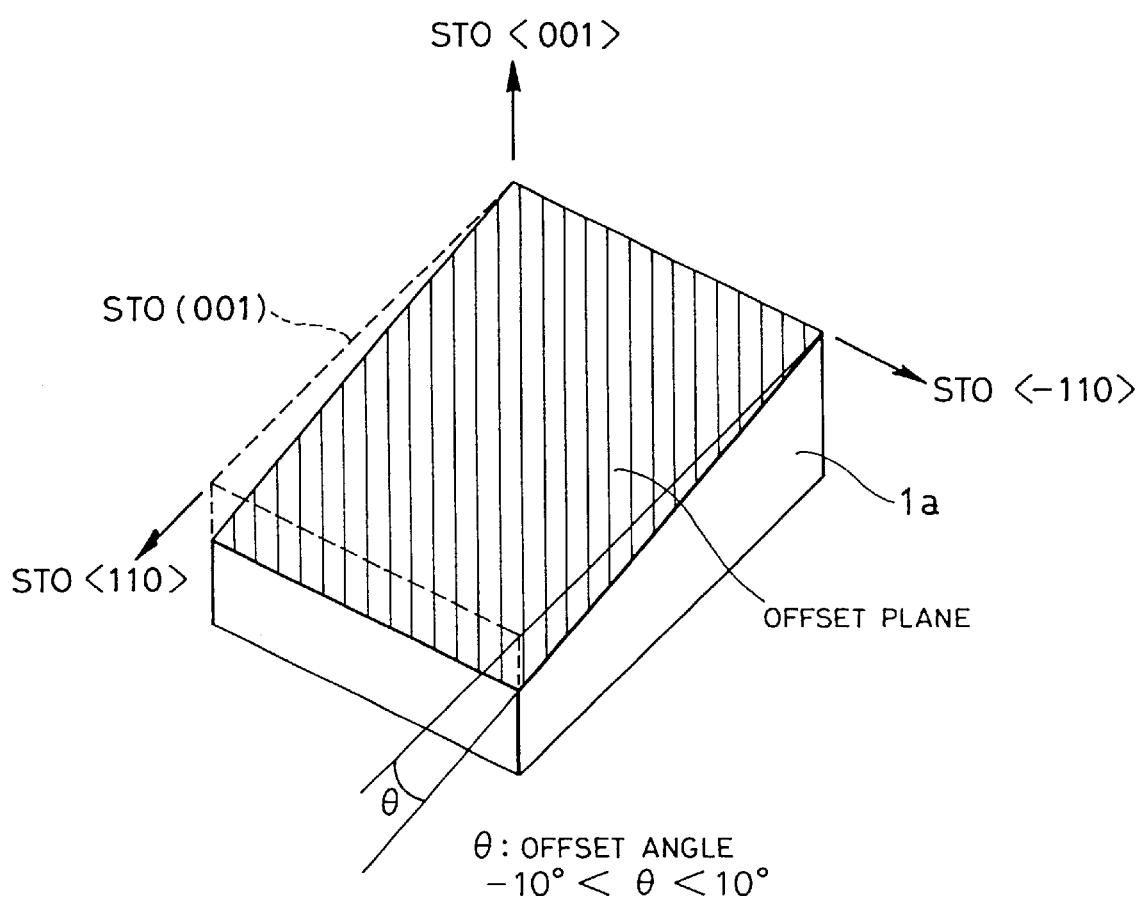
FIGS. 3 and 4 are schematic perspective views each showing a crystal substrate used in the embodiment according to the present invention.

In the embodiment, as shown in FIG. 3, an STO crystalline substrate is used having a surface which is inclined at an offset angle θ from a (001) plane of the crystalline substrate. A single crystalline film of KN is then grown on the offset plane to have a (010) plane by the MOCVD method which is good for mass production. This procedure allows the KN crystal to grow in order to be oriented along the b-axis and allows the a-axis to be oriented into the surface of the growth layer. The a-axis direction is one of the directions of the in-plane components of the crystalline axis of the thin KN crystalline film. At this time, the a-axis of the KN crystal is perpendicular to the plane defined by the normal direction of the offset STO substrate and the <001> direction of the STO. The angle θ of offset lies within the range of −10°<θ<10° (θ≠0°), preferably 4° to 7° or −7° to −4°. It becomes possible to use the orientation of <100> with a large electromechanical coupling factor that is advantageous for SAW devices of the KN crystal by allowing a SAW to propagate in the a-axis direction. The resulting lattice constants of the KN crystal with the a-axis, the b-axis, and c-axis are such that a=5.6896 Angstroms, b=3.9296 Angstroms, and c=5.7256 Angstroms.

In the case of epitaxial growth of a crystalline film on a substrate by means of not only the MOCVD but also other methods, it is generally difficult to obtain a good epitaxial film aligned on the substrate unless the lattice constants of the substrate and the crystalline film match each other. In the case of KN, it is also difficult to achieve the growth of the (010) plane.

The STO crystal is a cubic system, with the lattice constant equal to 3.9051 Angstroms. Therefore, in the case where the KN crystal of the rhombic system is grown on the STO crystal, the STO crystal has lattice constants of the a-axis and c-axis different from those of the KN crystal. Thus, for example, crystal growth of KN on the (110) plane of the STO substrate would provide only the KN (100) plane aligned along the a-axis. In addition, it is difficult to grow a good crystal of KN on the (001) plane of the STO substrate.

In this embodiment, a lattice plane offset from the STO (001) plane, that is, an inclined lattice plane is used without using the (001) plane of the STO. That is, as shown in FIG. 3, the KN crystal is grown on a mirror surface inclined at an offset angle of θ with respect to the <110> orientation from the (001) plane. Since the STO crystal has a lattice constant of 3.9051 Angstroms, the lattice constant in the <−110> orientation of the STO crystal is √2 times, that is, 5.52259 Angstroms, which is closer to the lattice constant of the a-axis of the KN. However, this is not good enough for the lattice constant of the c-axis to be matched. Thus, the plane is inclined at an offset angle of θ with respect to the <110> orientation from the (001) plane of the STO to match the ratio of the c-axis to the a-axis of the KN lattice constant such that the c-axis/a-axis=5.7256/5.6896=1.00632. For example, calculations are conducted for offset angles θ=1°, 4°, 5°, 6°, 7° and 10°. The calculations of the ratios, 5.52259/(5.52259/cosθ), of the axis obtained at an offset angle θ to the lattice constant 5.52259 Angstroms in the <−110> orientation of the STO provide results of 1.00015, 1.00244, 1.00381, 1.00550, 1.00750, and 1.01542 for those offset angles respectively. These values are closer to the c-axis/a-axis ratio of the KN crystal of 1.00632. Therefore, this makes it possible to grow the (010) plane of the KN on the offset plane with respect to the (001) plane of the STO. The aforementioned offset angle θ is preferably within the range of −10°<θ<10° (θ≠0°) in consideration of variations in lattice constant due to variations in temperature and composition of the perovskite structure.

Figure 4:
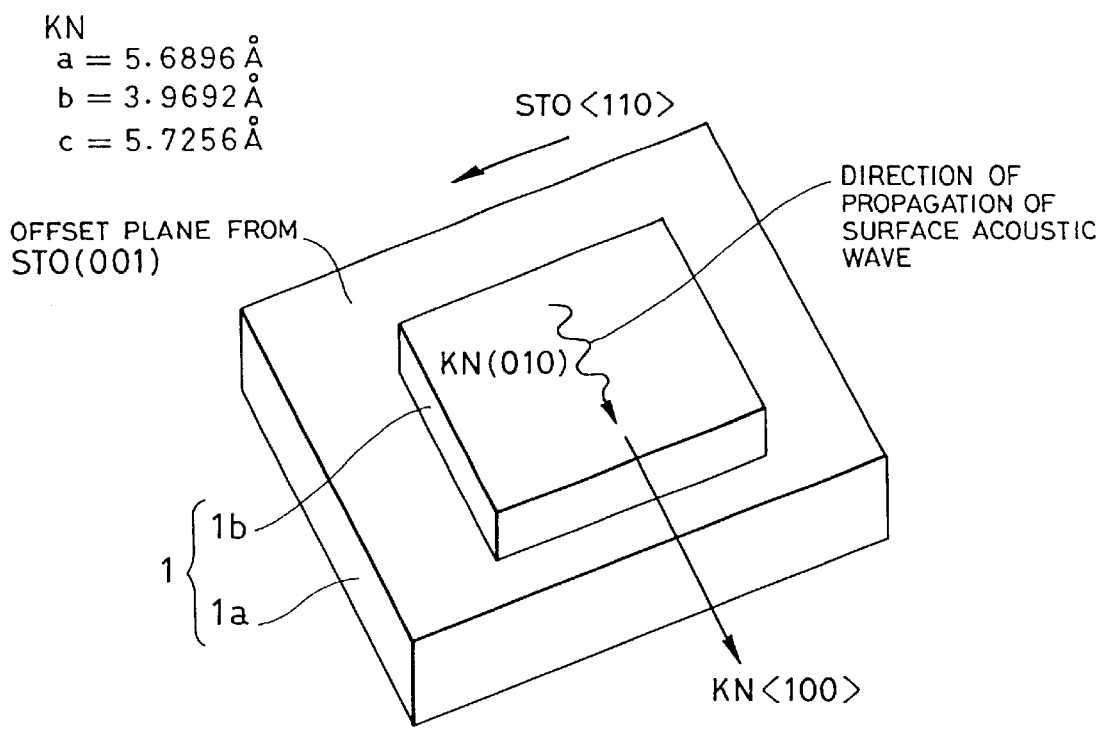

More specifically, a KN crystalline film was grown on a substrate having a mirror surface offset by an angle of 5° from the (001) plane of the STO. That is, the STO substrate having as the principal plane the mirror surface offset by 5° from the (001) plane is loaded to the reaction chamber of the MOCVD equipment. Then, the substrate is increased in temperature to a predetermined temperature with the pressure inside the reaction chamber being reduced to the predetermined atmospheric pressure. As starting materials, di-pivaloyl-meta sodium potassium [$K(C_{11}H_{19}O_2)$] (hereinafter referred to as K(DPM)) and penta-ethoxy niobium [$Nb(OC_2H_5)_5$] are loaded into the vaporizers of the equipment individually. These starting materials are kept at predetermined temperatures to be sublimed or vaporized into organic metallic compound gases. Then, each of the gases is guided into the reaction chamber, where the heated STO substrate is disposed, by means of an Ar carrier gas the flow of which is controlled. Thus, the gases are let onto the substrate as laminar flow to allow an epitaxial layer of KN to deposit on the substrate. In addition, the reactive gases may be added by a certain amount of oxygen since oxides are generated from the starting materials by oxidation reaction. As such, the substrate 1 as shown in FIG. 4 was obtained.

In the aforementioned embodiment, a case has been described where the STO of (001) was used as an offset substrate. However, a substrate of the cubic system crystal, for example, of the spinel structure such as [$(MgO)(Al_2O_3)$] or a substrate with the (001) plane of the crystalline rock salt structure such as MgO being offset can also provide a thin KN crystallin film of a similar structure.

Furthermore, on an STO substrate with an offset plane from (001), $KTaO_3$ or KTN($KTa_xNb_{1-x}O_3$ ($0<x<1$)) is first formed as a buffer layer, on which in turn KN is formed, and a KN thin piezoelectric crystalline film can thereby be formed.

According to the present invention, a thin crystalline film is used which comprises KN having a large electromechanical coupling factor being grown, by the MOCVD method, as a single crystal on a crystalline substrate having the perovskite structure, the spinel structure, or the rock salt structure. Devices operable at low power, with low loss, and with broad bandwidth characteristics can thereby be manufactured at low cost. In addition, compared with devices employing a bulk crystalline substrate, the device can provide improved mass productivity and is advantageous for miniaturization and integration.

What is claimed is:

1. A method for manufacturing a surface acoustic wave device, comprising the steps of:

forming a mirror surface inclined at an offset angle $\theta$ from a (001) plane of a crystalline substrate with a structure selected from a group consisting of a perovskite structure, a spinel structure, and a rock salt structure, growing, by chemical vapor deposition, a thin piezoelectric crystalline film with the perovskite structure, spinel structure or rock salt structure, on the inclined mirror surface of said crystalline substrate, and forming an electrode having electrode fingers arranged on said thin piezoelectric crystalline film in parallel to each other so that a surface acoustic wave propagates along one direction of crystalline axes of said thin piezoelectric crystalline film.

2. A method according to claim 1, wherein said thin piezoelectric crystalline film is composed of $KNbO_3$.

3. A method according to claim 2, wherein said crystalline substrate is composed of $SrTiO_3$.

4. A method according to claim 3, wherein said offset angle $\theta$ is set within a range of $-10°<\theta<10°$ ($\theta\neq0°$).

5. A method according to claim 4, wherein said thin piezoelectric crystalline film crystal is grown with an a-axis oriented in a surface growth layer thereof.

* * * * *